United States Patent
Mizuno et al.

(10) Patent No.: US 9,976,025 B2
(45) Date of Patent: May 22, 2018

(54) THERMALLY CONDUCTIVE MATERIAL

(71) Applicant: Kitagawa Industries Co., Ltd., Aichi (JP)

(72) Inventors: Takashi Mizuno, Aichi (JP); Yasuhiro Kawaguchi, Aichi (JP)

(73) Assignee: KITAGAWA INDUSTRIES CO., LTD., Aichi (JP)

( * ) Notice: Subject to any disclaimer, the term of this patent is extended or adjusted under 35 U.S.C. 154(b) by 0 days. days.

(21) Appl. No.: 15/523,006

(22) PCT Filed: Oct. 29, 2015

(86) PCT No.: PCT/JP2015/080564
§ 371 (c)(1),
(2) Date: Apr. 28, 2017

(87) PCT Pub. No.: WO2016/068240
PCT Pub. Date: May 6, 2016

(65) Prior Publication Data
US 2017/0321049 A1 Nov. 9, 2017

(30) Foreign Application Priority Data
Oct. 31, 2014 (JP) ................ 2014-222984

(51) Int. Cl.
C08K 5/13 (2006.01)
C08L 33/08 (2006.01)
H01L 23/373 (2006.01)
H05K 7/20 (2006.01)
C08K 3/22 (2006.01)

(52) U.S. Cl.
CPC ........... *C08L 33/08* (2013.01); *C08K 5/13* (2013.01); *H01L 23/373* (2013.01); *H05K 7/20* (2013.01); C08K 2003/2224 (2013.01); C08K 2003/2227 (2013.01)

(58) Field of Classification Search
CPC .............. C08L 33/08; C08K 5/13; H05K 7/20
See application file for complete search history.

(56) References Cited

U.S. PATENT DOCUMENTS

2007/0270527 A1* 11/2007 Horie ................ C08K 5/49
524/77
2011/0091708 A1   4/2011 Noda et al.
2014/0166258 A1   6/2014 Tamura et al.
2015/0299550 A1  10/2015 Kusunoki et al.

FOREIGN PATENT DOCUMENTS

| JP | 2009-179743 | 8/2009 |
| JP | 2010-229265 | 10/2010 |
| JP | 2011-219511 | 11/2011 |
| JP | 2012-007129 | 1/2012 |
| JP | 2012-233099 | 11/2012 |
| WO | 2009/133930 | 11/2009 |
| WO | 2013/100174 | 7/2013 |

OTHER PUBLICATIONS

International Search Report, International application No. PCT/JP2015/080564, dated Feb. 2, 2016.
International Preliminary Report on Patentability, International application No. PCT/JP2015/080564, dated Feb. 28, 2017.

* cited by examiner

*Primary Examiner* — Edward J Cain
(74) *Attorney, Agent, or Firm* — Koppel, Patrick, Heybl & Philpott

(57) ABSTRACT

A thermally conductive material is provided. The thermally conductive material includes: a polymer containing a thermally conductive filler and an antioxidant; the polymer being a polymer of a monomer containing an acrylic ester, a hindered phenol-based antioxidant being contained as the antioxidant, a thermal conductivity being 3.2 W/m·K or greater, and an initial Asker C hardness at ambient temperature being 22 or less.

14 Claims, 2 Drawing Sheets

THERMALLY CONDUCTIVE MATERIAL

CROSS-REFERENCE TO RELATED APPLICATION

This international application claims priority to Japanese Patent Application No. 2014-222984, filed to Japan Patent Office on Oct. 31, 2014, and the total contents of Japanese Patent Application No. 2014-222984 are hereby incorporated by reference.

TECHNICAL FIELD

The present disclosure relates to a thermally conductive material that is used by arranging the thermally conductive material to contact with a heat source, such as an electronic component, to promote heat dissipation from the heat source.

BACKGROUND ART

Conventionally, thermally conductive materials in which thermally conductive fillers are contained in elastomers, such as silicone rubbers or acrylic resins, have been known. Among the elastomers, silicone rubbers generate siloxane gases. The siloxane gases may negatively affect electronic devices. Therefore, various thermally conductive materials that use acrylic elastomers that generate no siloxane gas as substrates have been developed (see, e.g., Patent Document 1).

PRIOR ART DOCUMENTS

Patent Documents

Patent Document 1: Japanese Unexamined Patent Application Publication No. 2012-233099A

SUMMARY OF THE INVENTION

Problems to be Solved by the Invention

In the thermally conductive material described in Patent Document 1, a hindered phenol-based antioxidant and a thioether-based antioxidant are contained together with a plasticizer. By this, in the thermally conductive material described in Patent Document 1, flexibility of the thermally conductive material is maintained even when the thermally conductive material is used in a high temperature environment. However, the thermally conductive material described in Patent Document 1 uses a large amount of plasticizer. Because of this, thermal conductivity of the thermally conductive material is low and a large amount of thermally conductive filler needs to be contained in the thermally conductive material to increase the thermal conductivity. When a large amount of the thermally conductive filler is contained, hardness of the thermally conductive material is increased, thereby reducing adhesion to electronic components or the like. For example, with the thermally conductive material described in Patent Document 1, when a thermally conductive filler is contained in a manner that a thermal conductivity of 3 W/m·K or greater is achieved, the Asker C hardness at ambient temperature of the thermally conductive material becomes 30 or greater.

In an aspect of the present disclosure, a thermally conductive material that can maintain flexibility even when the thermally conductive material is used in a high temperature environment and that has high thermal conductivity and low hardness is preferably provided.

Means for Solving the Problems

An aspect of the present disclosure is a thermally conductive material including: a polymer containing a thermally conductive filler and an antioxidant; the polymer being a polymer of a monomer containing an acrylic ester, a hindered phenol-based antioxidant being contained as the antioxidant, a thermal conductivity being 3.2 W/m·K or greater, and an initial Asker C hardness at ambient temperature being 22 or less.

An antioxidant is contained originally in an amount approximately 0.01 wt. % in commercially available products of acrylic polymer (polymer of a monomer containing an acrylic ester). Therefore, even when an antioxidant is not added, ordinary elastomer sheets can be produced. On the other hand, the applicant of the present application found that flexibility of an elastomer produced using the acrylic polymer as a raw material is maintained in a high temperature environment by allowing a larger amount of antioxidant to be contained compared to the amount of the antioxidant originally contained in commercially available products.

Therefore, in a thermally conductive material of an aspect of the present disclosure, a thermally conductive filler and a hindered phenol-based antioxidant are contained in a polymer formed by polymerizing a monomer containing an acrylic ester, the thermal conductivity is 3.2 W/m·K or greater, and an initial Asker C hardness at ambient temperature is 22 or less. By this, the flexibility of the thermally conductive material is maintained even when the thermally conductive material is used in a high temperature environment.

Furthermore, when a hindered phenol-based antioxidant is contained in the thermally conductive material, the flexibility of the thermally conductive material in a high temperature environment can be maintained without blending a large amount of plasticizer. Therefore, excellent thermal conductivity is achieved even when a relatively small amount of thermally conductive filler is contained in the thermally conductive material, and a thermally conductive material having high thermal conductivity and low hardness can be obtained.

Note that, when the hindered phenol-based antioxidant is a semi-hindered phenol-based antioxidant, from 0.02 to 0.07 vol % of the antioxidant relative to the total amount of the thermally conductive material is preferably contained. When the compounded amount of the semi-hindered phenol-based antioxidant is less than 0.02 vol %, the effect of maintaining the flexibility may not be suitably exhibited. On the other hand, when the compounded amount of the semi-hindered phenol-based antioxidant is greater than 0.07 vol %, curing may not be achieved by heating.

Furthermore, the antioxidant is further preferably contained in an amount of 0.04 vol % or greater of the total amount of the thermally conductive material. The applicant of the present application found that, when 0.04 vol % or greater, relative to the total amount of the thermally conductive material, of the antioxidant is contained, hardness of the thermally conductive material at ambient temperature rapidly decreases. Therefore, when 0.04 vol % or greater, relative to the total amount of the thermally conductive material, of the antioxidant is contained, the hardness of the thermally conductive material can be favorably and further decreased.

Furthermore, when the hindered phenol-based antioxidant is a fully hindered phenol-based antioxidant, from 0.04 to 0.29 vol % of the antioxidant relative to the total amount of the thermally conductive material is preferably contained. When the compounded amount of the fully hindered phenol-based antioxidant is greater than 0.29 vol %, curing may not be achieved by heating.

Furthermore, although various substances can be used as the thermally conductive filler, at least titanate-treated aluminum hydroxide having an average particle size of 1 to 10

μm and higher fatty acid-treated magnesium hydroxide having an average particle size of 0.5 to 1.5 μm may be contained as the thermally conductive filler, and the content ratio of the aluminum hydroxide to the magnesium hydroxide in terms of weight ratio may be approximately 3:1.

When the thermally conductive material contains aluminum hydroxide and magnesium hydroxide as the thermally conductive filler, the flame retardancy thereof is enhanced. Furthermore, when titanate treatment or higher fatty acid treatment is performed on the thermally conductive filler, the effect of increasing hardness of the thermally conductive material by the thermally conductive filler is suppressed. Furthermore, as a result of an experiment, it was found that, when the titanate-treated aluminum hydroxide having an average particle size of 1 to 10 μm and the higher fatty acid-treated magnesium hydroxide having an average particle size of 0.5 to 1.5 μm were contained in a weight ratio of approximately 3:1, the highest thermal conductivity and lowest hardness were achieved. Note that "approximately 3:1" indicates, for example, a range expressed as 3:1 when the ratio is approximated as a ratio of one digit integers.

Furthermore, in this case, when silicon carbide having an average particle size of 50 to 100 μm and spherical aluminum oxide having an average particle size of 5 to 15 μm are contained as the thermally conductive filler, and the contents of these are greater, in terms of weight, than the total content of the aluminum hydroxide and the magnesium hydroxide, the thermal conductivity can be enhanced even further.

Furthermore, when the thermally conductive material is maintained at 130° C. for 500 hours, the change in the Asker C hardness is preferably within +15. In this case, the thermally conductive material exhibits even better heat resistance.

EXPLANATION OF REFERENCE NUMERALS

Figure 1:
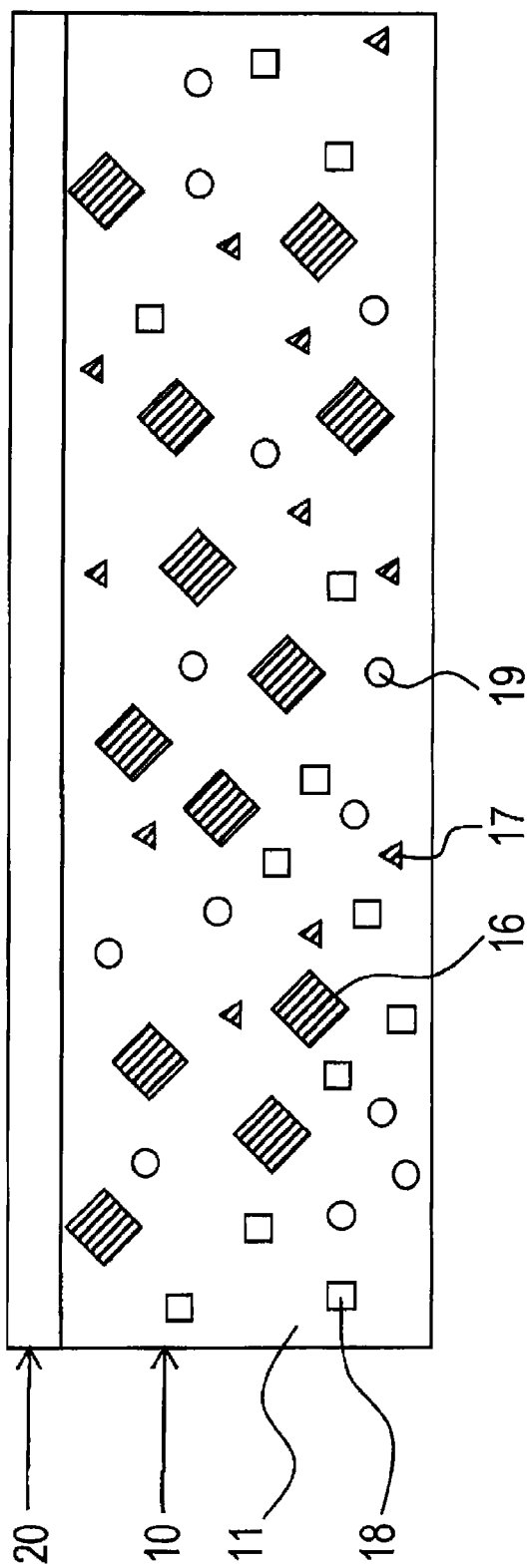
FIG. 1 is a schematic view illustrating the configuration of a thermally conductive material according to the present disclosure.

10 thermally conductive material
11 polymer
16 silicon carbide
17 aluminum hydroxide
18 spherical aluminum oxide
19 magnesium hydroxide
20 PET film

MODE FOR CARRYING OUT THE INVENTION

Examples

Embodiments of the present disclosure will be described below using drawings. As schematically illustrated in FIG. 1, the applicant of the present application produced a thermally conductive material 10, in which silicon carbide 16, aluminum hydroxide 17, spherical aluminum oxide 18, and magnesium hydroxide 19 were contained in a polymer 11 obtained by polymerizing a monomer containing an acrylic ester, and molded the thermally conductive material 10 into a sheet shape. Furthermore, a PET film 20 having a thickness of 5 μm was adhered onto one face of the thermally conductive material 10.

The applicant of the present application studied the change in characteristics by changing the composition of the thermally conductive filler (i.e., the silicon carbide 16, the aluminum hydroxide 17, the spherical aluminum oxide 18, and the magnesium hydroxide 19) and/or the composition of antioxidant contained in the polymer 11, as described in Table 1 below. Note that, in Table 1, the magnesium hydroxide 19 is written as "Mg hydroxide". In Table 1, the aluminum hydroxide 17 is written as "Al hydroxide". In Table 1, the spherical aluminum oxide 18 is written as "spherical Al oxide".

Furthermore, in this experiment, as an acrylic polymer, HD-A218 (trade name; manufactured by Nippon Shokubai Co., Ltd.) was used. As a polyfunctional monomer, 1,6HX-A (trade name; manufactured by Kyoeisha Chemical Co., Ltd.) was used. As a vulcanizing agent, Perkadox (trade name) 16 was used. As an antioxidant, a fully hindered phenol-based antioxidant represented by Formula (1) or a semi-hindered phenol-based antioxidant represented by Formula (2) was used.

[Chemical Formula 1]

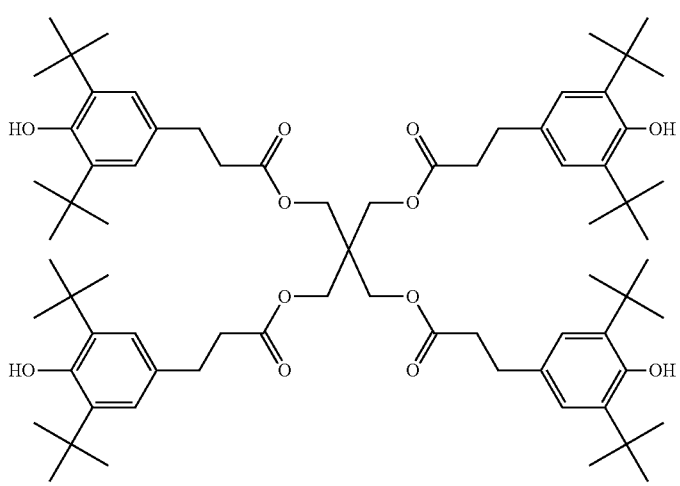

(1)

[Chemical Formula 2]

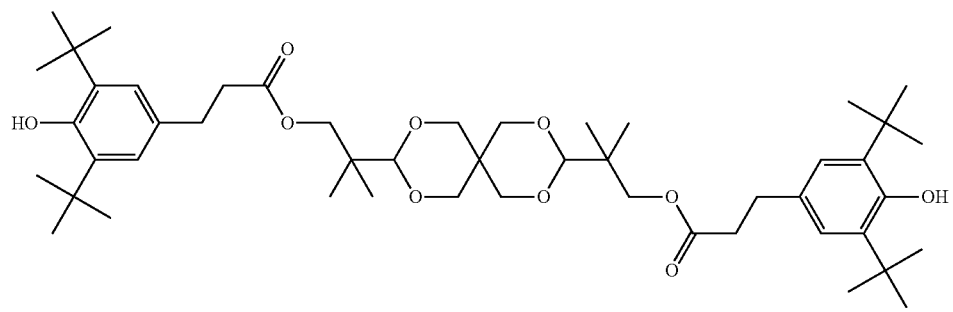

(2)

Furthermore, as the silicon carbide 16, CGF180 (trade name; manufactured by Showa Denko K.K.) having an average particle size of 80 μm and a specific gravity of 3.5 was used. As the aluminum hydroxide 17, aluminum hydroxide that had been titanate-treated and that had an average particle size of 7 μm and a specific gravity of 2.42 or aluminum hydroxide that had not been titanate-treated (untreated) and that had an average particle size of 10 μm and a specific gravity of 2.42 was used. As the spherical aluminum oxide 18, spherical aluminum oxide having an average particle size of 10 μm was used. As the magnesium hydroxide 19, magnesium hydroxide that had been higher fatty acid-treated and that had an average particle size of 1.1 μm and a specific gravity of 2.38 was used. Note that the average particle size can be measured by methods such as laser diffraction analysis, a centrifugal sedimentation method, image analysis, and the like; however, in this embodiment, the product descriptions of the commercially available products were used. According to the product descriptions, the particle sizes measured by laser diffraction analysis for aluminum hydroxide, aluminum oxide, and magnesium hydroxide and the particle size measured by using a standard sieve (JIS Z 8801) for silicon carbide were used as the average particle size.

TABLE 1

| | | Material | | | | |
|---|---|---|---|---|---|---|
| | | Acrylic polymer | Polyfunctional monomer | Vulcanizing agent | Fully hindered antioxidant A | Fully hindered antioxidant B |
| | | | | Specific gravity | | |
| | | 0.98 | 0.98 | 0.5 | 1.04 | 1.04 |
| | | | | Average particle size | | |
| | Composition | — | — | — | — | — |
| Sample 1 | Weight (g) | 21.98 | 0.022 | 0.22 | | 0.012 |
| | vol % | 36.2 | 0.04 | 0.71 | | 0.02 |
| Sample 2 | Weight (g) | 21.98 | 0.022 | 0.22 | | 0.018 |
| | vol % | 36.2 | 0.04 | 0.71 | | 0.03 |
| Sample 3 | Weight (g) | 21.98 | 0.022 | 0.22 | | 0.024 |
| | vol % | 36.2 | 0.04 | 0.71 | | 0.04 |
| Sample 4 | Weight (g) | 21.98 | 0.022 | 0.22 | | 0.048 |
| | vol % | 36.2 | 0.04 | 0.71 | | 0.07 |
| Sample 5 | Weight (g) | 21.98 | 0.022 | 0.22 | 0.024 | |
| | vol % | 36.2 | 0.04 | 0.71 | 0.04 | |
| Sample 6 | Weight (g) | 21.98 | 0.022 | 0.22 | 0.05 | |
| | vol % | 36.2 | 0.04 | 0.71 | 0.08 | |
| Sample 7 | Weight (g) | 21.98 | 0.022 | 0.22 | 0.075 | |
| | vol % | 36.2 | 0.04 | 0.71 | 0.12 | |
| Sample 8 | Weight (g) | 21.98 | 0.022 | 0.22 | 0.14 | |
| | vol % | 36.2 | 0.04 | 0.71 | 0.22 | |
| Sample 9 | Weight (g) | 21.98 | 0.022 | 0.22 | 0.19 | |
| | vol % | 36.1 | 0.04 | 0.71 | 0.29 | |
| Sample 10 | Weight (g) | 21.98 | 0.022 | 0.22 | | 0 |
| | vol % | 36.3 | 0.04 | 0.71 | | 0.00 |
| Sample 11 | Weight (g) | 21.98 | 0.022 | 0.22 | | 0.24 |
| | vol % | 36.1 | 0.04 | 0.71 | | 0.37 |
| Sample 12 | Weight (g) | 21.98 | 0.022 | 0.22 | 0.5 | |
| | vol % | 36.0 | 0.04 | 0.71 | 0.77 | |
| Sample 13 | Weight (g) | 21.98 | 0.022 | 0.22 | | 0.024 |
| | vol % | 36.2 | 0.04 | 0.71 | | 0.04 |
| Sample 14 | Weight (g) | 21.98 | 0.022 | 0.22 | | 0.024 |
| | vol % | 36.3 | 0.04 | 0.71 | | 0.04 |
| Sample 15 | Weight (g) | 21.98 | 0.022 | 0.22 | | 0.024 |
| | vol % | 36.2 | 0.04 | 0.71 | | 0.04 |

TABLE 1-continued

| | | Material | | | | | |
|---|---|---|---|---|---|---|---|
| | | Silicon carbide | Titanate-treated Al hydroxide | Untreated Al hydroxide | Spherical Al oxide | Higher fatty acid-treated Mg hydroxide | |
| | | Specific gravity | | | | | |
| | | 3.5 | 2.42 | 2.42 | 3.98 | 2.38 | |
| | | Average particle size | | | | | |
| | Composition | 63 | 7 | 10 | 10 | 1.1 | Overall |
| Sample 1 | Weight (g) | 47.91 | 23.96 | | 47.91 | 7.98 | 150.0 |
| | vol % | 22.1 | 16.0 | | 19.5 | 5.4 | 100.0 |
| Sample 2 | Weight (g) | 47.91 | 23.96 | | 47.91 | 7.98 | 150.0 |
| | vol % | 22.1 | 16.0 | | 19.5 | 5.4 | 100.0 |
| Sample 3 | Weight (g) | 47.91 | 23.96 | | 47.91 | 7.98 | 150.0 |
| | vol % | 22.1 | 16.0 | | 19.4 | 5.4 | 100.0 |
| Sample 4 | Weight (g) | 47.91 | 23.96 | | 47.91 | 7.98 | 150.0 |
| | vol % | 22.1 | 16.0 | | 19.4 | 5.4 | 100.0 |
| Sample 5 | Weight (g) | 47.91 | 23.96 | | 47.91 | 7.98 | 150.0 |
| | vol % | 22.1 | 16.0 | | 19.4 | 5.4 | 100.0 |
| Sample 6 | Weight (g) | 47.91 | 23.96 | | 47.91 | 7.98 | 150.0 |
| | vol % | 22.1 | 16.0 | | 19.4 | 5.4 | 100.0 |
| Sample 7 | Weight (g) | 47.91 | 23.96 | | 47.91 | 7.98 | 150.1 |
| | vol % | 22.1 | 16.0 | | 19.4 | 5.4 | 100.0 |
| Sample 8 | Weight (g) | 47.91 | 23.96 | | 47.91 | 7.98 | 150.1 |
| | vol % | 22.1 | 16.0 | | 19.4 | 5.4 | 100.0 |
| Sample 9 | Weight (g) | 47.91 | 23.96 | | 47.91 | 7.98 | 150.2 |
| | vol % | 22.1 | 16.0 | | 19.4 | 5.4 | 100.0 |
| Sample 10 | Weight (g) | 47.91 | 23.96 | | 47.91 | 7.98 | 150.0 |
| | vol % | 22.1 | 16.0 | | 19.5 | 5.4 | 100.0 |
| Sample 11 | Weight (g) | 47.91 | 23.96 | | 47.91 | 7.98 | 150.2 |
| | vol % | 22.0 | 15.9 | | 19.4 | 5.4 | 100.0 |
| Sample 12 | Weight (g) | 47.91 | 23.96 | | 47.91 | 7.98 | 150.5 |
| | vol % | 22.0 | 15.9 | | 19.3 | 5.4 | 100.0 |
| Sample 13 | Weight (g) | 47.91 | | 23.96 | 47.91 | 7.98 | 150.0 |
| | vol % | 22.1 | | 16.0 | 19.4 | 5.4 | 100.0 |
| Sample 14 | Weight (g) | 47.91 | 31.94 | | 47.91 | 0 | 150.0 |
| | vol % | 22.1 | 21.3 | | 19.5 | 0.0 | 100.0 |
| Sample 15 | Weight (g) | 47.91 | 15.97 | | 47.91 | 15.97 | 150.0 |
| | vol % | 22.1 | 10.7 | | 19.4 | 10.8 | 100.0 |

Characteristics of Samples 1 to 15 shown in Table 1 will be shown in Table 2. Note that, in Table 2, heat resistance was evaluated as described below. The sample with which the change in the Asker C hardness was within +15 when the thermally conductive material was maintained at 130° C. for 500 hours was evaluated as "excellent". A sample in which the change in the Asker C hardness exceeded +15 when the thermally conductive material was maintained at 130° C. for 500 hours but the change in the Asker C hardness was within +15 when the thermally conductive material was maintained at 120° C. for 500 hours was evaluated as "fair". A sample in which the change in the Asker C hardness exceeded +15 when the thermally conductive material was maintained at 120° C. for 500 hours was evaluated as "poor". Furthermore, the raw material curability was evaluated as follows. A sample that was suitably cured by heating was evaluated as "excellent". A sample in which curing by heating was somewhat difficult was evaluated as "fair". A sample that was not cured by heating was evaluated as "poor".

TABLE 2

| Product number Specific gravity Average particle size Particle size range | Content | Material | | | | | |
|---|---|---|---|---|---|---|---|
| | | Thermal conductivity W/m · K | Hardness ASKERC | Flame retardancy | Heat resistance | Raw material curability | Total |
| Sample 1 | Antioxidant B was added (0.02 vol %) | 3.2 | 22 | V-2 | Fair | Excellent | Fair |
| Sample 2 | Proportion of antioxidant B was changed (0.03 vol %) | 3.2 | 22 | V-2 | Fair | Excellent | Fair |
| Sample 3 | Proportion of antioxidant B was changed (0.04 vol %) | 3.3 | 20 | V-2 | Excellent | Excellent | Excellent |

TABLE 2-continued

| | | Material | | | | | |
|---|---|---|---|---|---|---|---|
| Product number Specific gravity Average particle size Particle size range | Content | Thermal conductivity W/m · K | Hardness ASKERC | Flame retardancy | Heat resistance | Raw material curability | Total |
| Sample 4 | Proportion of antioxidant B was changed (0.07 vol %) | 3.3 | 17 | V-2 | Excellent | Fair | Fair |
| Sample 5 | Antioxidant A was added (0.04 vol %) | 3.3 | 20 | V-2 | Fair | Excellent | Fair |
| Sample 6 | Proportion of antioxidant A was changed (0.08 vol %) | 3.3 | 19 | V-2 | Fair | Excellent | Fair |
| Sample 7 | Proportion of antioxidant A was changed (0.12 vol %) | 3.3 | 19 | V-2 | Excellent | Excellent | Excellent |
| Sample 8 | Proportion of antioxidant A was changed (0.22 vol %) | 3.3 | 16 | V-2 | Excellent | Fair | Fair |
| Sample 9 | Proportion of antioxidant A was changed (0.29 vol %) | 3.3 | 13 | V-2 | Excellent | Fair | Fair |
| Sample 10 | No antioxidant (0 vol %) | 3.2 | 24 | V-2 | Poor | Excellent | Poor |
| Sample 11 | Proportion of antioxidant B was changed (0.37 vol %) | Impossible to measure (due to poor raw material curability) | | | | Poor | Poor |
| Sample 12 | Proportion of antioxidant A was changed (0.77 vol %) | Impossible to measure (due to poor raw material curability) | | | | Poor | Poor |
| Sample 13 | Aluminum hydroxide was changed | 3.0 | 25 | V-2 | Excellent | Excellent | Poor |
| Sample 14 | Aluminum hydroxide:magnesium hydroxide Ratio was changed (1:0) | 3.1 | 25 | V-2 | Fair | Excellent | Poor |
| Sample 15 | Aluminum hydroxide:magnesium hydroxide Ratio was changed (1:1) | 2.8 | 22 | V-2 | Fair | Excellent | Poor |

Discussion

As shown in Tables 1 and 2, an experiment was performed by fixing the composition of the thermally conductive filler (i.e., weights of from silicon carbide to magnesium hydroxide) in Samples 1 to 12. Among these, Samples 1 to 4, in which from 0.02 to 0.07 vol % of the semi-hindered phenol-based antioxidant relative to the total amount of the thermally conductive material was added, exhibited the heat resistances of fair or better and the raw material curabilities of fair or better. However, Samples 3 and 4, in which 0.04 vol % or 0.07 vol % of the semi-hindered phenol-based antioxidant was contained, exhibited the heat resistances of excellent. On the other hand, Samples 1 and 2, in which 0.02 vol % or 0.03 vol % of the semi-hindered phenol-based antioxidant was contained, exhibited the heat resistances of fair. Furthermore, with Samples 1 to 3, in which from 0.02 to 0.04 vol % of the semi-hindered phenol-based antioxidant was contained, the raw material curabilities were excellent. On the other hand, with Sample 4, in which 0.07 vol % of the semi-hindered phenol-based antioxidant was contained, the raw material curability was fair. Therefore, the content of the semi-hindered phenol-based antioxidant is more preferably greater than 0.03 vol % and less than 0.07 vol %.

Sample 11, in which 0.37 vol % of the semi-hindered phenol-based antioxidant was contained, was not cured by heating due to excessively high fluidity (recorded as "raw material curability: poor" in Table 2), and the thermal conductivity, the hardness, the flame retardancy, and the heat resistance were not able to be measured.

Sample 3, in which 0.04 vol % of the semi-hindered phenol-based antioxidant was contained, achieved both the heat resistance of excellent and the raw material curability of excellent. Including this Sample 3, with Samples 1 to 4, the thermal conductivities were 3.3 or 3.2, which were excellent values. Furthermore, with Samples 1 to 4, the Asker C hardnesses at ambient temperature were excellent values of 22 or less. Furthermore, Samples 1 to 4 achieved flame retardancies that were equivalent to the flammability level of V-2 of the UL-94 Standard. Therefore, in Table 2, the overall result of Sample 3 (written as "Overall" in Table 2) was excellent and the overall results of Samples 1, 2, and 4 were fair. Note that the Asker C hardness was the so-called initial hardness before the heat stability test described in Patent Document 1 or the like was performed.

Note that, in Samples 1 to 10, 22.1 vol % of the silicon carbide 16 was contained as a thermally conductive filler. Furthermore, in Samples 1 to 10, 16.0 vol % of the titanate-treated aluminum hydroxide 17 was contained. Furthermore, in Samples 1 to 10, 19.5 or 19.4 vol % of the spherical aluminum oxide (i.e., spherical aluminum oxide 18) was contained. Furthermore, in Samples 1 to 10, 5.4 vol % of the higher fatty acid-treated magnesium hydroxide 19 was contained. It is conceived that these contribute to the thermal conductivity, the hardness, and the flame retardancy. For example, compared to Sample 3, whose overall result was excellent, with Sample 13 in which the aluminum hydroxide 17 was changed to the untreated aluminum hydroxide although the composition was the same, the Asker C hardness at ambient temperature was increased from 20 to 25. Furthermore, with Samples 14 and 15, in which the proportions of the titanate-treated aluminum hydroxide 17 and the higher fatty acid-treated magnesium hydroxide 19 were changed from those of Sample 3, the hardness of Sample 14 was increased and the thermal conductivity of Sample 15 was decreased.

However, also with Samples 13 to 15, the heat resistances of fair or better were exhibited and the raw material curabilities of excellent were exhibited. On the other hand, with Sample 5 in which the amount of the antioxidant was not changed from that of Sample 3 but a fully hindered phenol-based antioxidant was used in place of the semi-hindered phenol-based antioxidant, the heat resistance was deteriorated from excellent to fair. With Sample 6 in which 0.08 vol % of the fully hindered phenol-based antioxidant was contained, the heat resistance was fair. However, with Samples 7 to 9 in which from 0.12 to 0.29 vol % of the fully hindered phenol-based antioxidant was contained, the heat resistances were fair. Furthermore, Sample 10, in which none of these antioxidants was contained, exhibited the heat resistance of poor. From these, it was found that, by allowing from 0.02 to 0.07 vol % of a semi-hindered phenol-based antioxidant relative to the total amount of the thermally conductive material to be contained, the heat resistance of fair or better was achieved, that is the flexibility of the thermally conductive material 10 was maintained even when the thermally conductive material was used in a high temperature environment. Furthermore, it was found that, when 0.04 to 0.29 vol % of the fully hindered phenol-based antioxidant was contained, the overall result of fair or better was achieved. Furthermore, it was found that, when 0.04 to 0.29 vol % of the fully hindered phenol-based antioxidant was contained, the heat resistance of fair or better was achieved, that is the flexibility of the thermally conductive material 10, was maintained even when the thermally conductive material was used in a high temperature environment.

Furthermore, with Samples 1 to 9 and 13 to 15, even when a large amount of plasticizer was not contained, unlike Patent Document 1, it was possible to maintain the flexibility of the thermally conductive material 10 in a high temperature environment. Note that a plasticizer is contained originally in the commercially available acrylic polymer to some degree and is also contained in Samples 1 to 15. However, this amount is extremely small compared to the content described in Patent Document 1. Therefore, with Samples 1 to 9 and 13 to 15, the thermal conductivities were enhanced even when a relatively small amount of thermally conductive filler was contained, and both the high thermal conductivity and the low hardness were achieved compared to those of the samples described in Patent Document 1.

Figure 2:
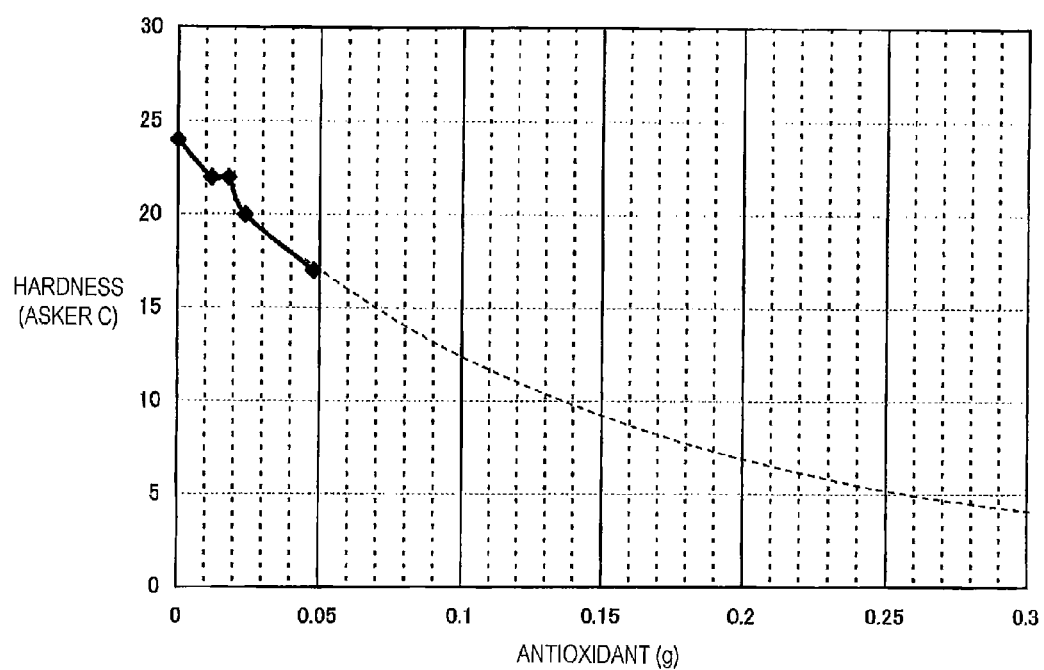
FIG. 2 is a graph showing the relationship between the content of the antioxidant and the hardness.

Furthermore, regarding Samples 1 to 4 and 10, when the relationship between the content (i.e., weight) of the semi-hindered phenol-based antioxidant and the Asker C hardness at ambient temperature is expressed using a graph, the graph shown in FIG. 2 is obtained. From this graph, it was found that, when 0.04 vol % or greater (i.e., 0.024 g or greater) of the antioxidant was contained relative to the total amount of the thermally conductive material, the Asker C hardness of the thermally conductive material 10 at ambient temperature was rapidly decreased. Therefore, when 0.04 vol % or greater, relative to the total amount of the thermally conductive material, of the antioxidant is contained, the hardness of the thermally conductive material 10 can be favorably and further decreased.

The thermally conductive material of each sample contained aluminum hydroxide and magnesium hydroxide as the thermally conductive filler. Therefore, except Samples 11 and 12, which were not able to be measured, the thermally conductive material of each sample achieved flame retardancy that was equivalent to V-2. Furthermore, the thermally conductive materials of Samples 1 to 9 contained the titanate-treated aluminum hydroxide 17 having an average particle size of 7 μm and the higher fatty acid-treated magnesium hydroxide 19 having an average particle size of 1.1 μm in a weight ratio of approximately 3:1. Because of this, the thermally conductive materials of Samples 1 to 9 achieved higher thermal conductivities and low hardnesses.

Furthermore, the thermally conductive materials of Samples 1 to 9 contained the silicon carbide 16 having an average particle size of 80 μm and the spherical aluminum oxide 18 having an average particle size of 10 μm as the thermally conductive filler. The content of the silicon carbide 16 and the content of the spherical aluminum oxide 18 were greater, in terms of weight, than the total content of the aluminum hydroxide 17 and the magnesium hydroxide 19. Because of this, the thermally conductive materials of Samples 1 to 9 achieved higher thermal conductivities.

Furthermore, the thermally conductive materials 10 of Samples 3, 5, 6, and 7 exhibited the Asker C hardnesses of 20 or less and the raw material curabilities of excellent. Therefore, the thermally conductive materials 10 of Samples 3, 5, 6, and 7 had excellent flexibility and good adhesion to a heat source, such as an electronic component, and/or a PET film 20. Because of this, heat generated by the heat source, such as an electronic component, can be suitably released to a radiator, such as a heat sink. Furthermore, among the front face and back face of the thermally conductive material 10 molded into a sheet shape, the face on which the PET film 20 was not laminated has tackiness, and thus, the thermally conductive material 10 can be equipped on an electronic component or the like without using adhesive tape or the like that inhibits the thermal conductivity, thereby favorably and further exhibiting the thermal conductivity.

Other Embodiments of Present Disclosure

Note that the present disclosure is not limited to the embodiment described above, and various modifications can be performed in a scope that does not exceed the gist of the present disclosure. For example, it is conceived that the same experimental result can be obtained even when the average particle size of the silicon carbide 16 is changed to a range of 50 to 100 μm. It is conceived that the same experimental result can be obtained even when the average particle size of the titanate-treated aluminum hydroxide 17 is changed to a range of 1 to 10 μm. It is conceived that the same experimental result can be obtained even when the average particle size of the untreated aluminum hydroxide is changed to a range of 5 to 15 μm. It is conceived that the same experimental result can be obtained even when the average particle size of the spherical aluminum oxide 18 is changed to a range of 5 to 15 μm. It is conceived that the same experimental result can be obtained even when the average particle size of the higher fatty acid-treated magnesium hydroxide 19 is changed to a range of 0.5 to 1.5 μm. It is conceived that the same experimental result can be obtained even when the compounded amount of each thermally conductive filler is changed by approximately ±10%. Furthermore, in the thermally conductive material of the present disclosure, other substances besides those described above can be used as a thermally conductive filler.

Furthermore, as the polymer 11, various polymers can be used as long as the polymer is a polymer obtained by polymerizing a monomer containing an acrylic ester. For example, as the polymer 11, a polymer obtained by polymerizing or copolymerizing an acrylic monomer, such as ethyl(meth)acrylate, n-propyl(meth)acrylate, i-propyl(meth)acrylate, n-butyl(meth)acrylate, i-butyl(meth)acrylate, 2-ethylhexyl(meth)acrylate, n-hexyl(meth)acrylate, n-amyl(meth)acrylate, i-amyl(meth)acrylate, octyl(meth)acrylate, i-octyl(meth)acrylate, i-myristyl(meth)acrylate, lauryl(meth)acrylate, nonyl(meth)acrylate, i-nonyl(meth)acrylate, i-decyl(meth)acrylate, tridecyl(meth)acrylate, stearyl(meth)acrylate, and i-stearyl(meth)acrylate, can be used. Note that the acrylic ester used during the (co)polymerization may be used alone or two or more types of the acrylic esters may be used in combination.

Furthermore, as the bifunctional acrylate-based polyfunctional monomer, 1,6-hexanediol diacrylate, ethylene glycol diacrylate, or the like can be used. As the tri- or higher functional acrylate-based polyfunctional monomer, trimethylolpropane triacrylate, pentaerythritol hexaacrylate, dipentaerythritol hexaacrylate, or the like can be used.

The invention claimed is:

1. A thermally conductive material comprising:
a polymer containing a thermally conductive filler and an antioxidant;
the polymer being a polymer of a monomer containing an acrylic ester,
titanate-treated aluminum hydroxide having an average particle size of 1 to 10 μm and higher fatty acid-treated magnesium hydroxide having an average particle size of 0.5 to 1.5 μm being at least contained as the thermally conductive filler,
a hindered phenol-based antioxidant being contained as the antioxidant,
a thermal conductivity being 3.2 W/m·K or greater, and
an initial Asker C hardness at ambient temperature being 22 or less.

2. The thermally conductive material according to claim 1, wherein the hindered phenol-based antioxidant is a semi-hindered phenol-based antioxidant; and
from 0.02 to 0.07 vol % of the antioxidant relative to the total amount of the thermally conductive material is contained.

3. The thermally conductive material according to claim 1, wherein the hindered phenol-based antioxidant is a fully hindered phenol-based antioxidant; and
from 0.04 to 0.29 vol % of the antioxidant relative to the total amount of the thermally conductive material is contained.

4. The thermally conductive material according to any one of claim 1, wherein a content ratio of the aluminum hydroxide to the magnesium hydroxide in terms of weight ratio is approximately 3:1.

5. The thermally conductive material according to claim 4, wherein said thermally conductive filler further comprises silicon carbide having an average particle size of 50 to 100 μm and spherical aluminum oxide having an average particle size of 5 to 15 μm; and
wherein an amount of the silicon carbide and an amount of the spherical aluminum oxide are each greater, in terms of weight, than the total content of the aluminum hydroxide and the magnesium hydroxide.

6. The thermally conductive material according to any one of claim 1, wherein a change in the Asker C hardness is within +15 when the thermally conductive material is maintained at 130° C. for 500 hours.

7. The thermally conductive material according to claim 2, wherein a content ratio of the aluminum hydroxide to the magnesium hydroxide in terms of weight ratio is approximately 3:1.

8. The thermally conductive material according to claim 7, wherein said thermally conductive filler further comprises silicon carbide having an average particle size of 50 to 100 μm and spherical aluminum oxide having an average particle size of 5 to 15 μm; and
wherein an amount of the silicon carbide and an amount of the spherical aluminum oxide are each greater, in terms of weight, than the total content of the aluminum hydroxide and the magnesium hydroxide.

9. The thermally conductive material according to claim 3, wherein a content ratio of the aluminum hydroxide to the magnesium hydroxide in terms of weight ratio is approximately 3:1.

10. The thermally conductive material according to claim 9, wherein said thermally conductive filler further comprises silicon carbide having an average particle size of 50 to 100 μm and spherical aluminum oxide having an average particle size of 5 to 15 μm; and
wherein an amount of the silicon carbide and an amount of the spherical aluminum oxide are each greater, in terms of weight, than the total content of the aluminum hydroxide and the magnesium hydroxide.

11. The thermally conductive material according to claim 2, wherein a change in the Asker C hardness is within +15 when the thermally conductive material is maintained at 130° C. for 500 hours.

12. The thermally conductive material according to claim 3, wherein a change in the Asker C hardness is within +15 when the thermally conductive material is maintained at 130° C. for 500 hours.

13. The thermally conductive material according to claim 4, wherein a change in the Asker C hardness is within +15 when the thermally conductive material is maintained at 130° C. for 500 hours.

14. The thermally conductive material according to claim 5, wherein a change in the Asker C hardness is within +15 when the thermally conductive material is maintained at 130° C. for 500 hours.

* * * * *